(12) United States Patent
Lan et al.

(10) Patent No.: US 8,409,456 B2
(45) Date of Patent: Apr. 2, 2013

(54) PLANARIZATION METHOD FOR HIGH WAFER TOPOGRAPHY

(75) Inventors: Shun-Wei Lan, Taipei (TW); Jieh-Jang Chen, Hsinchu (TW); Shih-Wei Lin, Taipei (TW); Feng-Jia Shiu, Jhudong Township (TW); Hung Chang Hsieh, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 169 days.

(21) Appl. No.: 13/090,763

(22) Filed: Apr. 20, 2011

(65) Prior Publication Data
US 2012/0270398 A1 Oct. 25, 2012

(51) Int. Cl.
*B44C 1/22* (2006.01)
(52) U.S. Cl. .......................... 216/38; 438/694
(58) Field of Classification Search .................. 216/38; 438/697, 694, 699
See application file for complete search history.

(56) References Cited

U.S. PATENT DOCUMENTS 5,312,512 A * 5/1994 Allman et al. ................ 438/624
6,689,697 B1 * 2/2004 Jiang et al. .................... 438/706

* cited by examiner

*Primary Examiner* — Roberts Culbert
(74) *Attorney, Agent, or Firm* — Lowe Hauptman Ham & Berner, LLP

(57) ABSTRACT

A method for planarizing a semiconductor device includes providing a substrate having at least one opening therein, each opening defining a lower portion and an upper portion; coating a light sensitive material layer over the substrate, the light sensitive material layer covering the lower and upper portions of the at least one opening; etching back the light sensitive material layer to expose the upper portion of the at least one opening; repeating the steps of coating and etching to remove a predetermined amount below the upper portion of the at least one opening; depositing an insulating layer over the substrate; and planarizing the insulating layer until the upper portion of the at least one opening is exposed.

24 Claims, 3 Drawing Sheets

PLANARIZATION METHOD FOR HIGH WAFER TOPOGRAPHY

FIELD

The disclosure relates generally to methods for fabricating semiconductor devices and, more particularly, to a planarization method utilized in manufacturing semiconductor devices having high wafer topography.

BACKGROUND

The semiconductor integrated circuit (IC) industry has experienced rapid growth. Technological advances in IC materials and designs have produced generations of ICs where each generation has smaller and more complex circuits than the previous generation. However, these advances have increased the complexity of processing and manufacturing ICs. in the course of integrated circuit revolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs.

As semiconductor device sizes continue to shrink, it has become increasingly difficult to meet device planarization requirements in fabrication. Planarization methods known to the inventors typically involve performing a chemical-mechanical-polishing (CMP) process on a semiconductor wafer. However, these traditional planarization methods have not been able to achieve satisfactory performance for wafers having high topography (more than 5 µm), such as those used in MicroElectroMechanical Systems (MEMS) process technologies. MEMS have multiple deposited films that are as much as 10-20 times thicker in some cases than CMOS counterparts. Large step heights and fissures called "seams" that are often formed between insulating material layers present a challenge to CMP and/or etch hack planarization. During planarization CMP loading resulting from a high topography wafer may cause undesirable "dishing" of the insulating material resulting in a nonplanar surface and the opening up of seams. Consequently, the surface of the wafer may not be flat or planar enough for subsequent fabrication processes. For example, the surface of the wafer may not be able to be patterned because of the limited depth of focus in lenses in optical lithography and the loss of linewidth control during photolithography. Acceptable wafer planarity in wafers having high topography is therefore critical for chip yield and long-term reliability.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-6 are cross-sectional views of a portion of a semiconductor device 10 at various fabrication stages, according to one embodiment of the present disclosure. As an example, the semiconductor device 10 illustrated in FIGS. 1-6 is a portion of a semiconductor wafer. It is understood that FIGS. 1-6 have been simplified for a better understanding of the inventive concepts of the present disclosure.

Figure 1:
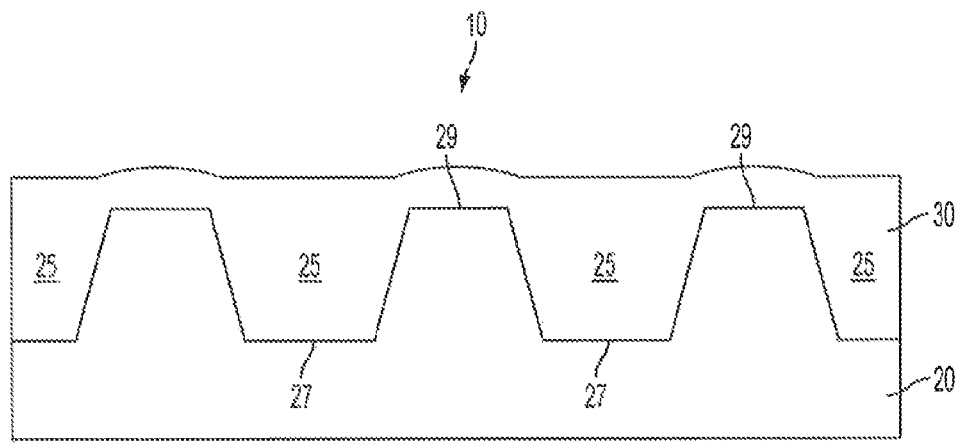
FIGS. 1-6 are cross-sectional views of a portion of a semiconductor device at various fabrication stages according to an embodiment of the present disclosure.

Referring to FIG. 1, the semiconductor device 10 includes a substrate 20. The substrate 20 is a semiconductor substrate comprising silicon. Alternatively, the substrate 20 comprises another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, and/or GaInAsP; or combinations thereof. In yet another alternative, the substrate 20 is a semiconductor on insulator (SOT). In other alternatives, semiconductor substrate 20 may include a doped epitaxial (epi) layer, a gradient semiconductor layer, and/or a semiconductor layer overlying another semiconductor layer of a different type, such as a silicon layer on a silicon germanium layer.

One or more openings 25 may be formed in the substrate 20, each of the openings 25 having a lower portion 27 and an upper portion 29. Openings 25 are formed by any suitable process. As one example, openings 25 may be formed by a photolithography process and etching an opening or trench in the substrate 20 by using a dry etching, wet etching, and/or other etching methods.

A light sensitive material layer 30 is thereafter formed over the substrate 20 to cover the lower portion 27 and the upper portion 29 of the one or more openings 25. The light sensitive material layer 30 may include a photoresist layer, a polyimide layer, a spin-on glass (SOG) layer, or a resin layer, for example. Where the layer of the light sensitive material 30 is a photoresist layer, the photoresist layer may include a polymer, photoacid generator, and a solvent. The photoresist layer may further include additives, such as base quenchers, surfactants, dyes, crosslinkers, other suitable additives, or combinations thereof. The photoresist layer may be a positive-type or negative-type resist material. One exemplary resist material is a chemical amplifying (CA) resist. The light sensitive material layer 30 may have a multi-layer structure. For example, the light sensitive material layer 30 may further include an anti-reflective coating (ARC) layer, such as a top ARC layer, a bottom ARC layer, or both a top and bottom ARC layer.

The light sensitive material layer 30 is formed in an approximately conformal manner, for example, by a process such as a spin-on coating process. The light sensitive material layer 30 has a thickness sufficient to cover the openings 25, and oftentimes, due to these openings, the surface of the light sensitive material layer 30 may be uneven, rough, and may even have humps after the deposition. Subsequent fabrication processes may require the surface of the light sensitive material layer 30 to be relatively flat and smooth prior to the deposition of a material, such as an insulating layer on the substrate 20.

Following the deposition of the light sensitive material layer 30 on substrate 20, the semiconductor device 10 may undergo a baking process to harden the light sensitive material layer 30 and to improve the adhesion of the light sensitive material layer 30 to the surface of the substrate 20. The baking process also prepares the semiconductor device 10 for subsequent processing, such as becoming more resistant to etch.

Figure 2:
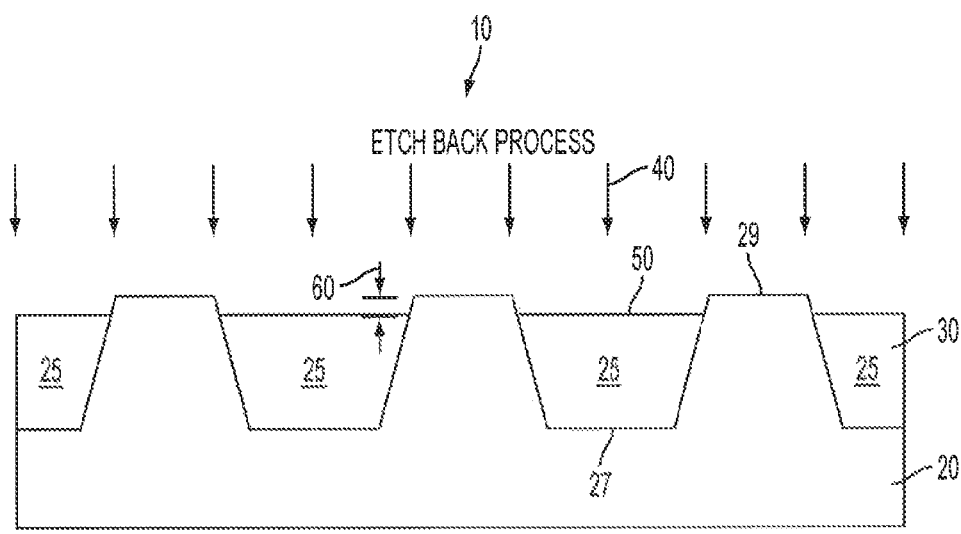

Referring now to FIG. 2, an etch back process 40 (may also be referred to an etching back process) is performed on the semiconductor device 10 to remove a portion of the light sensitive material layer 30 thereby exposing an upper portion 29 of the one or more openings 25. In an exemplary embodiment, the etch back process 40 may use an oxygen based dry etching chemistry. In another exemplary embodiment, the etch back process 40 is a plasma dry etching process and includes the following process parameters (among others):

an etchant that includes a gas mixture of tetrafluoromethane ($CF_4$) and trifluoromethane ($CHF_3$), wherein a ratio of the $CF_4$ gas and the $CHF_3$ gas is in a range from about 0 to about 1;

a radio-frequency (RF) power that is in a range from about 200 watts to about 600 watts; and a bias voltage from about 50 volts to about 250 volts.

At this stage of fabrication, even after the etch back process 40, the surface of the semiconductor device 10 may not be flat or planar enough for subsequent fabrication processes. To illustrate, as shown in FIG. 2, the surface of the semiconductor device 10 may have a total surface variation 60. The total surface variation 60 measures the flatness of the surface of the semiconductor device 10. As an example, the total surface variation 60 may be defined as the difference (or variation) between the upper portion 29 of the opening 25 and the surface 50 of the light sensitive material layer 30. Oftentimes, the total surface variation 60 exceeds what is acceptable for subsequent fabrication processes, in one example, at this stage of fabrication the surface of the semiconductor device 10 has a total surface variation 60 that is less than about 0.5 µm. In another example, the surface of the semiconductor device 10 has a total surface variation 60 that is between about 0.3 µm and about 0.5 µm. A total surface variation 60 of zero (0) means that there is no difference between the upper portion 29 and the surface 50 of the light sensitive material layer 30 and the surface of the semiconductor device 10 is essentially flat or planar. Thus, according to various aspects of the present disclosure, the process described below will further reduce the total surface variation of the semiconductor device 10 to achieve a substantially flat or planar profile conducive for subsequent fabrication processes.

Prior to the etch back process 40, an optional photolithography process may be performed on the semiconductor device 10 to remove a portion of the light sensitive material layer 30 thereby exposing an upper portion 29 of the one or more openings 25. The photolithography process forms a patterned light sensitive material layer 30 (not shown) on substrate 20. The terms photolithography, lithography, immersion lithography, and optical lithography may be used interchangeably in the present disclosure. The photolithography process includes an exposure process, where the light sensitive material layer 30 is exposed to radiation to transfer a pattern (e.g., a geometric pattern) from a photomask to the light sensitive material layer 30. More than one photomask, also referred to as a mask or reticle, may be utilized for the lithography process. The radiation causes a chemical change in exposed regions of the light sensitive material layer 30, which may increase or decrease solubility of the exposed regions. If the exposed regions become more soluble, the light sensitive material layer 30 is referred to as a positive photoresist. If the exposed regions become less soluble, the light sensitive material layer 30 is referred to as a negative photoresist.

The radiation beam used to expose the light sensitive material layer 30 may be ultraviolet and/or extended to include other radiation beams, such as ion beam, x-ray, extreme ultraviolet, deep ultraviolet, and other radiation energies. The lithography process may implement krypton fluoride (KrF) excimer lasers, argon fluoride (ArF) excimer lasers, ArF immersion lithography, ultraviolet (UV) radiation, extreme ultra-violet (EUV) radiation, and/or electron-beam writing (e-beam). The exposing process may also be implemented or replaced by other proper methods, such as maskless photolithography, ion-beam writing, an/or molecular imprint techniques. It is understood that a single exposure patterning process, double exposure patterning process, or multiple exposure patterning process may be utilized.

The lithography process further includes a developing process that selectively removes the exposed or unexposed regions to a developing solution to create the patterned light sensitive material layer 30 (not shown) over the substrate 20. The developing solution may include, for example tetramethylammonium hydroxide (TMAH). The developing solution may remove the exposed or unexposed portions depending on the resist type. The lithography process may also include baking processes, such as a post-exposure bake (PEB) or pre-exposure bake, and/or rinsing processes that are performed before and/or after exposing the light sensitive material layer 30.

After the etch back process 40, a curing process is performed on the light sensitive material layer 30. The curing process prevents the light sensitive material layer 30 from swelling or dissolving when a material layer is formed thereover, and/or from being affected by additional processes such as exposure, development, and etch back. The curing process may include radiation curing, thermal curing, or a combination thereof. The thermal or radiation curing processes initiate cross-linking reactions within the light sensitive material layer 30, thereby solidifying the light sensitive material layer 30. In a radiation curing example, cross-linking reactions in the light sensitive material layer 30 are initiated by exposing the light sensitive material layer 30 to an appropriate wavelength of light, such as ultraviolet (UV) radiation and/or deep ultraviolet (DUV) radiation wavelengths, for a period of time specific to the particular composition of the light sensitive material layer 30. In a thermal curing example, the light sensitive material layer 30 is heated to a desired temperature or range of temperatures for a period of time. For example, the temperature range may be from about 150° C. to about 300° C. Alternatively, an e-beam curing process may be implemented.

Figure 3:
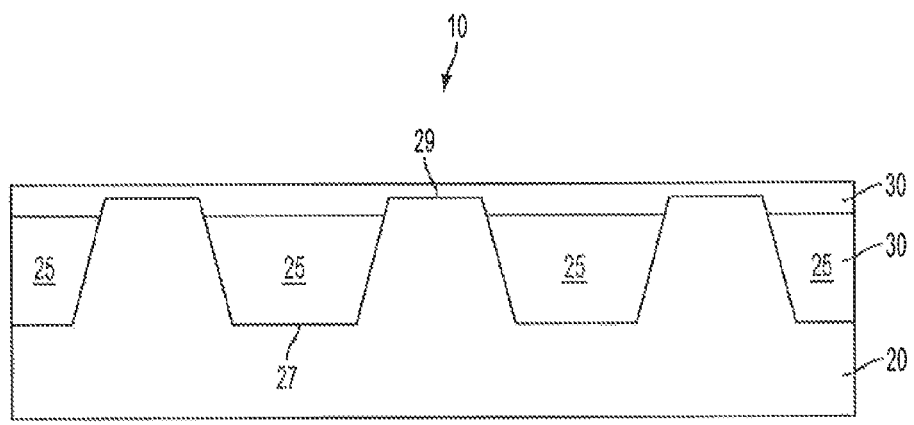
Figure 4:
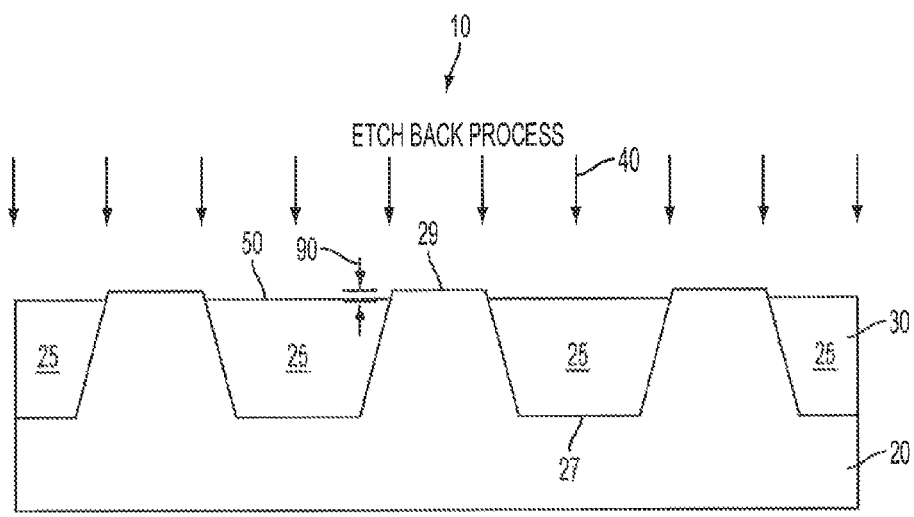

The steps of depositing a light sensitive material layer 30 on substrate 20 and thereafter performing an etch back process 40 are repeated as shown in FIGS. 3 and 4, respectively. By repeating these steps, the total surface variation may be reduced and the surface of the semiconductor device 10 can achieve better flatness. As the deposition and etch back steps are similar to the ones described above, a description of these steps will not be repeated here.

With reference to FIG. 4, following a second etch back step 40 on semiconductor device 10, a portion of the light sensitive material layer 30 is removed, thereby exposing an upper portion 29 of the one or more openings 25. At this stage in fabrication, the surface of the semiconductor device 10 has a total surface variation 90 that is less than the total surface variation 60 of the semiconductor device 10, as described with reference to the first etch back process depicted in FIG. 2. In other words, after the subsequent etch back process 40, the surface of the semiconductor device 10 is flatter or more planar than the surface of the semiconductor device 10 as described with reference to the etch back process of FIG. 2. In one example, at this stage of fabrication, the surface of the semiconductor device 10 has a total surface variation 90 of about 0.3 μm. In another example, the surface of the semiconductor device 10 has a total surface variation 90 of less than about 0.3 μm.

The steps of depositing a light sensitive material layer 30 and etching back the light sensitive material layer 30 may be repeated n number of times in order that the surface of the semiconductor device 10 achieves a flat or planar enough surface acceptable for subsequent fabrication processes.

Figure 5:
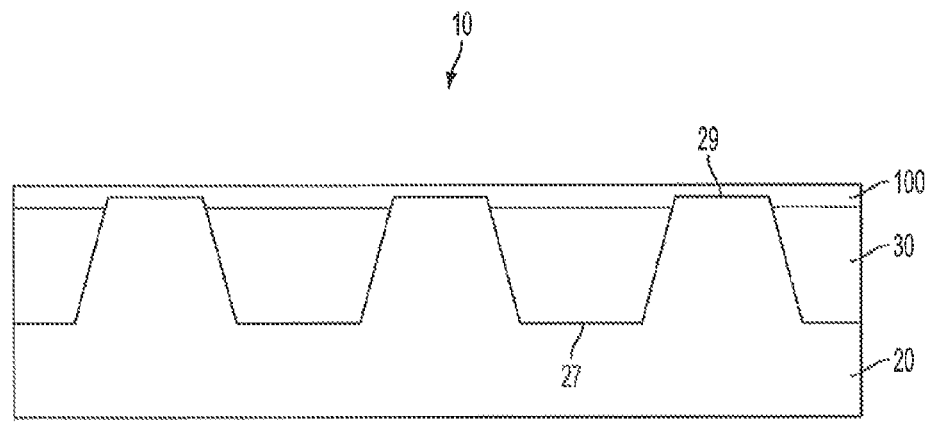

Referring now to FIG. 5, an insulating layer 100 is formed on substrate 20. In an embodiment, the insulating layer 100 includes an oxide material. The insulating layer 100 may be formed using a deposition process, such as a chemical vapor deposition (CVD) process, a physical vapor deposition (PVD) process, an atomic layer deposition (ALD) process, combinations thereof, or another suitable process. The insulating layer 100 is deposited on substrate 20 at a thickness sufficient to allow the planarization of the insulating layer 100 at a later step to be substantially planar. The thickness of the insulating layer 100 depends on the total surface variation 90 of the semiconductor device 10. As an example, the lower the total surface variation 90, the lower the thickness of the insulation layer 100 needs to be in order to allow the planarization of the insulating layer 100 at a later step to be substantially planar. On the other hand, the higher the total surface variation 90, the higher the thickness of the insulating layer 100 needs to be in order to allow the planarization of the insulating layer 100 at the later step to be substantially planar.

Figure 6:
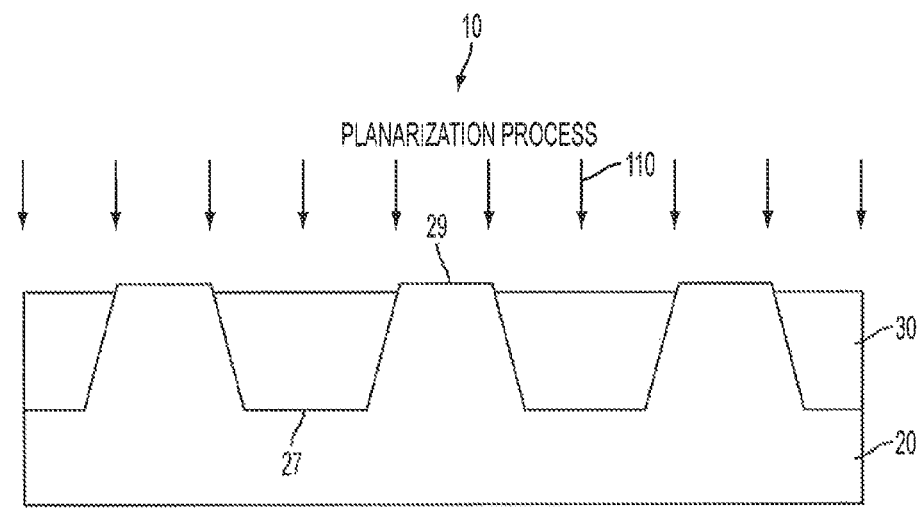

Following the deposition of the insulating layer 100 on substrate 20, a chemical mechanical planarization (CMP) process 110 is performed on the semiconductor device 10 to make the surface flatter or more planar. The planarization process 110 is performed on the insulating layer 100 until an upper portion 29 of the one or more openings 25 is exposed, as depicted in FIG. 6. The planarization process 110 may also include an optional etch back process to further flatten or planarize the surface of the semiconductor device 10 acceptable for subsequent fabrication processes. According to one embodiment of the present disclosure, following the planarization step the insulating layer 100 is substantially planar when the variance of the insulating layer 100 has a thickness that is less than about 0.8 μm as measured from the center of the wafer to the edge of the wafer. In another embodiment, the insulating layer 100 is substantially planar when the variance of the insulating layer 100 has a thickness that is less than about 0.5 μm as measured from the wafer center to the wafer edge. In yet another embodiment, the insulating layer 100 is substantially planar when the variance of the insulating layer 100 has a thickness that is less than about 0.3 μm as measured from the wafer center to the wafer edge.

It is understood that additional processes may be performed to complete the fabrication of the semiconductor device 10 to form various features. Subsequent fabrication processing may further form various contacts/vias/lines and multilayer interconnect features (e.g., metal layers and interlayer dielectrics) on the substrate 20, configured to connect the various features or structures of the semiconductor device 10. The additional features may provide electrical interconnection to the device. For example, a multilayer interconnection includes vertical interconnects, such as vias and contacts, and horizontal interconnects, such as metal lines. Transistor devices may be formed in the semiconductor device 10. The wafers containing these semiconductor devices may also undergo passivation, slicing, and packaging processes.

The embodiments of the present disclosure discussed above have advantages over existing methods. It is understood, however, that other embodiments may have different advantages, and that no particular advantage is required for all embodiments. One of the advantages is that a substantially planar surface of a material layer (such as an insulating layer or a polysilicon layer) may be achieved for wafers having high topography (more than 5 μm), such as those used in MEMS process technologies. The substantially planar surface may have a total surface variation of less than about 0.3 μm, which is much better than what can be achieved using existing planarization techniques.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method for planarizing a semiconductor device, comprising:
   providing a substrate having at least one opening therein, each opening defining a lower portion and an upper portion;
   coating a light sensitive material layer over the substrate, the light sensitive material layer covering the lower and upper portions of the at least one opening;
   etching back the light sensitive material layer to expose the upper portion of the at least one opening;
   repeating the steps of coating and etching to remove a predetermined amount below the upper portion of the at least one opening;
   depositing an insulating layer over the substrate; and
   planarizing the insulating layer until the upper portion of the at least one opening is exposed.

2. The method of claim 1, wherein a material of the light sensitive material layer comprises one of a photoresist material, a polyimide, a spin-on glass (SOG) material, or resins.

3. The method of claim 1, after the step of coating the light sensitive material layer over the substrate further comprising performing a lithography process on the light sensitive material layer that exposes the upper portion of the at least one opening.

4. The method of claim 1, further comprising curing the light sensitive material layer after the step of etching back the light sensitive material layer.

5. The method of claim 1, wherein the predetermined amount is an amount of the light sensitive material layer removed that allows the insulating layer to be deposited at a thickness sufficient to allow the planarization of the insulating layer to be substantially planar.

6. The method of claim 5, wherein the insulating layer is substantially planar when the variance of the insulating layer has a thickness that is less than about 0.8 μm measured from the wafer center to the wafer edge after planarization.

7. The method of claim 1, wherein the planarization step includes one of a chemical mechanical planarization (CMP) step or CMP and an etching back step.

8. A method for planarizing a semiconductor device, comprising:
providing a substrate having at least one opening therein, each opening defining a lower portion and an upper portion;
coating a light sensitive material layer over the substrate, the light sensitive material layer covering the lower and upper portions of the at least one opening;
etching back the light sensitive material layer to remove a first predetermined amount of the light sensitive material layer, the first predetermined amount defined as the thickness measured from the surface of the light sensitive material layer to the upper portion of the at least one opening;
repeating the coating and etching steps to remove a second predetermined amount of the light sensitive material layer, the second predetermined amount defined as the thickness measured from the surface of the light sensitive material layer to the upper portion of the at least one opening, the second predetermined amount being less than the first predetermined amount;
depositing an insulating layer over the substrate; and
planarizing the insulating layer until the upper portion of the at least one opening is exposed.

9. The method of claim 8, wherein a material of the light sensitive material layer comprises one of a photoresist material, a polyimide, a spin-on glass (SOG) material, or resins.

10. The method of claim 8, after the step of coating the light sensitive material layer over the substrate further comprising performing a lithography process on the light sensitive material layer that exposes the upper portion of the at least one opening.

11. The method of claim 8, wherein the first predetermined amount is from about 0.3 μm to about 0.5 μm.

12. The method of claim 8, wherein the second predetermined amount is an amount of the light sensitive material layer removed that allows the insulating layer to be deposited at a thickness sufficient to allow the planarization of the insulating layer to be substantially planar.

13. The method of claim 12, wherein the insulating layer is substantially planar when the variance of the insulating layer has a thickness that is less than about 0.8 μm measured from the wafer center to the wafer edge after planarization.

14. The method of claim 8, wherein the second predetermined amount is less than about 0.3 μm.

15. The method of claim 8, wherein the planarization step includes one of a chemical mechanical planarization (CMP) step or CMP and an etching back step.

16. A method for planarizing a semiconductor device, comprising:
providing a substrate having at least one opening therein, each opening defining a lower portion and an upper portion;
coating a light sensitive material layer over the substrate, the light sensitive material layer covering the lower and upper portions of the at least one opening;
etching back the light sensitive material layer to expose the upper portion of the at least one opening such that the semiconductor device has a first total surface variation (TSV), the first TSV defined as the difference between the upper portion of the opening and the surface of the light sensitive layer; and
repeating the steps of coating and etching such that the surface of the semiconductor device has a second TSV, the second TSV being less than the first TSV.

17. The method of claim 16, further comprising depositing an insulating layer over the substrate.

18. The method of claim 16, further comprising planarizing the insulating layer until the upper portion of the at least one opening is exposed.

19. The method of claim 16, wherein the first TSV is less than about 0.5 μm.

20. The method of claim 16, wherein the second TSV is less than about 0.3 μm.

21. The method of claim 16, wherein the second TSV is less than about 0.1 μm.

22. The method of claim 16, Wherein the second TSV is 0.

23. A method for planarizing a semiconductor device, comprising:
providing a substrate having at least one opening therein, each opening defining a lower portion and an upper portion;
coating a light sensitive material layer over the substrate, the light sensitive material layer covering the lower and upper portions of the at least one opening;
etching back the light sensitive material layer to expose the upper portion of the at least one opening;
repeating the coating and etching steps such that a subsequently deposited insulating layer over the substrate is deposited at a predetermined thickness sufficient to allow the planarization of the insulating layer to be substantially planar;
depositing the insulating layer over the substrate; and
planarizing the insulating layer until the upper portion of the at least one opening is exposed.

24. The method of claim 23, wherein the insulating layer is substantially planar when the variance of the insulating layer has a thickness that is less than about 0.8 μm measured from the wafer center to the wafer edge after planarization.

* * * * *